United States Patent
Nardi et al.

(10) Patent No.: US 11,397,790 B2
(45) Date of Patent: Jul. 26, 2022

(54) VECTOR MATRIX MULTIPLICATION WITH 3D NAND

(71) Applicant: SanDisk Technologies LLC, Addison, TX (US)

(72) Inventors: Federico Nardi, San Jose, CA (US); Gerrit Jan Hemink, San Jose, CA (US); Won Ho Choi, San Jose, CA (US)

(73) Assignee: SanDisk Technologies LLC, Addison, TX (US)

(*) Notice: Subject to any disclaimer, the term of this patent is extended or adjusted under 35 U.S.C. 154(b) by 656 days.

(21) Appl. No.: 16/452,418

(22) Filed: Jun. 25, 2019

(65) Prior Publication Data
US 2020/0410037 A1    Dec. 31, 2020

(51) Int. Cl.
| | |
|---|---|
| *G06F 17/16* | (2006.01) |
| *G06F 9/30* | (2018.01) |
| *G11C 16/26* | (2006.01) |
| *G11C 16/08* | (2006.01) |
| *G11C 16/24* | (2006.01) |
| *G06N 3/063* | (2006.01) |

(52) U.S. Cl.
CPC ............ *G06F 17/16* (2013.01); *G06F 9/3001* (2013.01); *G06F 9/30036* (2013.01); *G06N 3/0635* (2013.01); *G11C 16/08* (2013.01); *G11C 16/24* (2013.01); *G11C 16/26* (2013.01)

(58) Field of Classification Search
None
See application file for complete search history.

(56) References Cited

U.S. PATENT DOCUMENTS

| | | | | |
|---|---|---|---|---|
| 9,025,382 | B2* | 5/2015 | Rhie | G11C 16/10 365/185.13 |
| 9,887,011 | B1* | 2/2018 | Hung | G11C 16/10 |
| 2012/0081948 | A1* | 4/2012 | Takemura | G11C 11/4097 365/149 |
| 2014/0071756 | A1* | 3/2014 | Iwai | H01L 27/1157 365/185.11 |
| 2019/0164046 | A1* | 5/2019 | Song | G06N 3/0635 |

OTHER PUBLICATIONS

Micheloni, R. et al. Array Architectures of 3-D NAND Flash Memories,2017, IEEE,16 pages. (Year: 2017).*
Wang, P. et al., Three-Dimensional NAND Flash for Vector-Matrix Multiplication, Apr. 2019, IEEE, pp. 988-991. (Year: 2019).*

* cited by examiner

*Primary Examiner* — Eric Coleman
(74) *Attorney, Agent, or Firm* — Vierra Magen Marcus LLP (57) ABSTRACT

An apparatus performs vector matrix multiplication (VMM) for an analog neural network (ANN). The apparatus includes a column of NAND flash cells in series, where each NAND flash cell includes a control gate; a bit line connected to the column of NAND flash cells, where a current drawn from the NAND flash cells flows to the bit line; an integrator connected to the bit line; and a controller having programmed instructions to control the column of NAND flash cells by setting the voltage of the control gate of each NAND flash cell.

20 Claims, 5 Drawing Sheets

VECTOR MATRIX MULTIPLICATION WITH 3D NAND

FIELD

The disclosure generally relates to the field of neural networks, and more specifically, to vector matrix multiplication (VMM) using 3D NAND flash technology configured in neural networks.

BACKGROUND

With the advancement of technology, various approaches for machine learning are being developed. One popular approach for machine learning involves neural networks. Neural networks are modeled as collections of connected neurons where the outputs of neurons in one layer serve as the inputs to the neurons in another layer. The neurons in one layer can be fully connected to the neurons in another layer. For example, each neuron in a first layer can have a pairwise connection to each of the neurons in a second layer. One popular application for neural networks today is image recognition. Here, the neural network learns to identify images that contain an object (e.g., a dog) by analyzing example images that have been labeled as that object.

SUMMARY

One embodiment of the invention relates to an apparatus that performs vector matrix multiplication (VMM) using an analog neural network (ANN). The apparatus of this embodiment includes a plurality of blocks of 3D NAND flash cells having a plurality of control gates. The plurality of blocks are arranged in a stack where the stack represents a layer of the ANN and a resistance of each 3D NAND flash cell in the plurality of blocks represents a weight in the ANN. The apparatus also includes a plurality of word lines with a first word line that is electrically connected to the plurality of control gates of the 3D NAND flash cells in a first block. The apparatus further includes a first bit line electrically that is connected to the 3D NAND flash cells of the first block and a controller having programmed instructions to receive an input to be processed by the ANN. The controller, during a read operation, applies a read voltage, via the first word line, to control gates of the 3D NAND flash cells in the first block such that a first current flows to the first bit line. The controller, during the read operation, also applies a pass voltage, via the plurality of word lines except the first word line, to control gates of the 3D NAND flash cells in the plurality of blocks except the first block such that a second current flows to the first bit line.

Another embodiment relates to an apparatus that performs VMM for an ANN using a plurality of blocks of 3D NAND flash cells including a plurality of control gates. The plurality of blocks are arranged in a plurality of stacks, and each stack represents a layer of the ANN and a resistance of each 3D NAND flash cell in the plurality of blocks represents a weight in the ANN. The apparatus further includes a plurality of word lines with a first word line being electrically connected to the plurality of control gates of the 3D NAND flash cells in the same block. The apparatus also includes a plurality of bit lines with a first bit line electrically connected to a first block of 3D NAND flash cells in a first stack and a second block of 3D NAND flash cells in a second stack. The apparatus has a controller with programmed instructions to receive an input to be processed by the ANN. The controller, during a read operation, selects the first word line and deselects the plurality of word lines connected to the first stack except the first word line. The controller applies a read voltage, via the first word line, to control gates of the 3D NAND flash cells in the first block such that a first current flows to the first bit line. Furthermore, the controller applies a pass voltage, via the plurality of word lines except the first word line, to control gates of the 3D NAND flash cells in other blocks such that a second current flows to the first bit line.

Yet still another embodiment relates to an apparatus that performs VMM for an analog neural network (ANN). The apparatus includes a column of NAND flash cells in series, where each NAND flash cell includes a control gate; a bit line connected to the column of NAND flash cells, where a current drawn from the NAND flash cells flows to the bit line; an integrator connected to the bit line; and a controller having programmed instructions to control the column of NAND flash cells by setting the voltage of the control gate of each NAND flash cell.

The foregoing summary is illustrative only and is not intended to be in any way limiting. In addition to the illustrative aspects, embodiments, and features described above, further aspects, embodiments, and features will become apparent by reference to the following drawings and the detailed description.

DETAILED DESCRIPTION

In the following detailed description, reference is made to the accompanying drawings that form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

In modern computing, memory is typically located separately (off-chip) from the processing circuitry. During reading and writing operations for such systems, a processor has to access the memory through long wires, which can cause delays and higher power consumption. This configuration can be an issue for neural networks because of how much processing is required. For example, typical artificial neural networks use vector matrix multiplication (VMM) between the input values—represented in the form of a vector—and the weights in the hidden layers—represented in the form of a matrix. In a typical computing system, a processor must constantly read from and write to the off-chip memory to perform the VMM processes.

To solve these problems of delays and excessive power consumption, processing-in-memory (PIM) has been identified as a potential solution. In PIM, processing is performed where the memory is located such that delays and power consumption caused by memory accesses are minimized. One approach is the use of resistive memories such as resistive random access memory (ReRAM) in crossbar arrays. ReRAM is a promising candidate for next-generation of non-volatile memories for PIM in neural networks because of its structure, high switching speed, and high scalability. In a ReRAM crossbar array, the resistance of the memory device corresponds to the weight of a particular connection between two nodes (i.e., neurons) of the neural network. However, ReRAM arrays can be difficult to manufacture, and performance and reliability can be less than desired.

This disclosure describes various embodiments of a new structure for performing PIM. In particular, 3D NAND flash memory is used as the PIM backbone for VMM. Flash memory is in wide use today as storage (e.g., USB flash drives) because of its low power consumption, persistent nature, and lower cost. The inventors have developed a way to utilize 3D NAND flash memory to perform the VMM in analog neural network applications.

Figure 1:
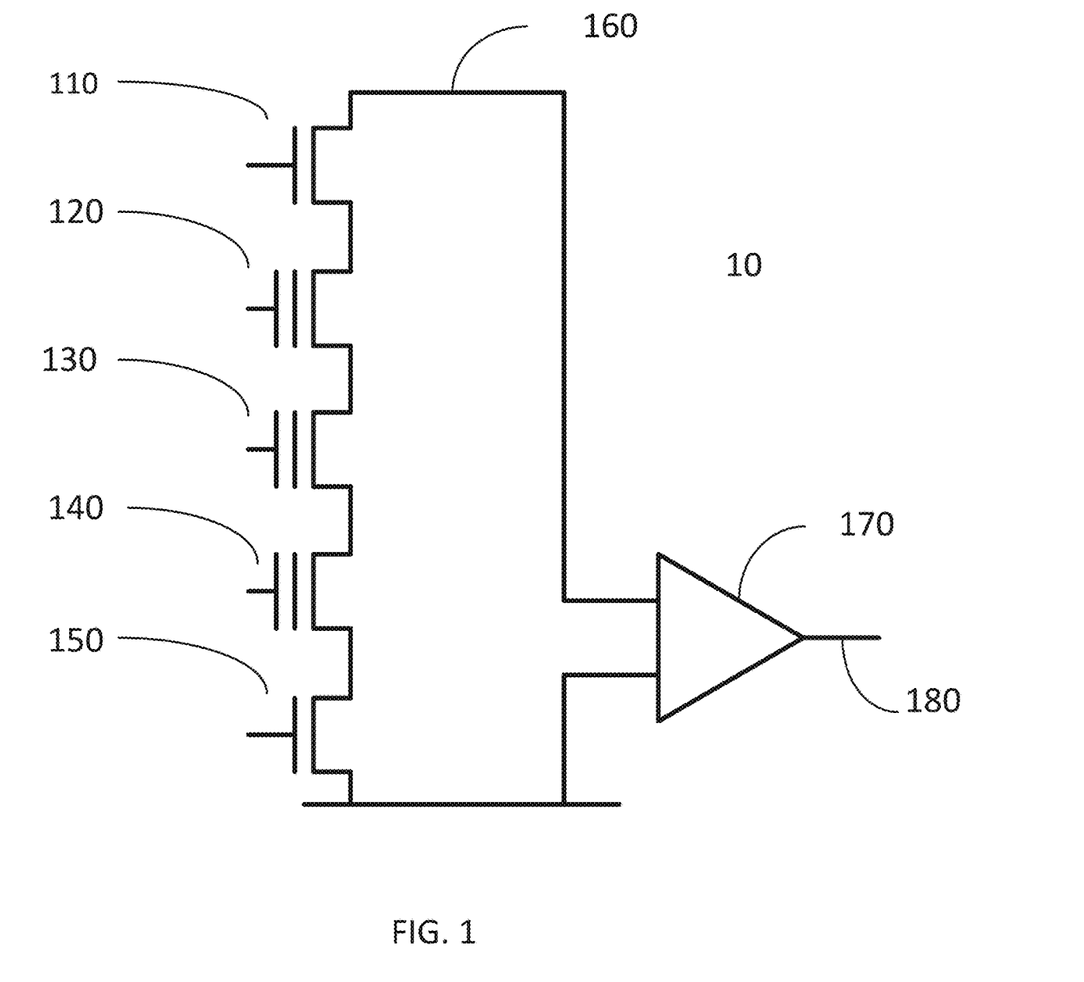
FIG. 1 is a block diagram of a column of 3D NAND flash cells and a current integrator according to an example embodiment.

FIG. 1 shows a block diagram of a column of 3D NAND flash cells and a current integrator according to an embodiment. FIG. 1 illustrates two select transistors 110 and 150, three flash cells 120, 130 and 140 in series, a bit line 160, and an integrator 170 that outputs to output 180. Although only three flash cells are shown in FIG. 1, one of ordinary skill will appreciate that there could be more, including 64 or 96 flash cells in series.

Top select transistor 110 and bottom select transistor 150 are switching transistors used to select the column of 3D NAND flash cells. When a column of 3D NAND flash cells is chosen, the corresponding top and bottom select transistors 110 and 150 are turned on to enable current to flow therethrough. When a column of 3D NAND flash cells is not chosen, the top and bottom select transistors 110 and 150 can be turned off so that current does not flow therethrough. The source of top select transistor 110 is connected to the drain of the first flash cell 120, and the drain of top select transistor 110 is connected to the bit line 160. The source of bottom select transistor 150 is connected to ground, and the drain of bottom select transistor 150 connected to the third flash cell 140's source.

First flash cell 120, second flash cell 130, and third flash cell 140 are 3D NAND flash cells. Although floating gate transistors are shown and described herein as the structure of each flash cell, charge-trapping transistors can be used instead of floating gate transistors.

A flash device is non-volatile, meaning that the device retains its memory even after the power is turned off because a flash device includes a floating gate between a control gate and a body, and the floating gate is able to accumulate electrons. When a high voltage is applied to the control gate, electrons from the channel tunnel through an oxide layer between the floating gate and the channel such that the electrons are trapped in the floating gate. In typical flash memory devices, when enough electrons are trapped inside the floating gate, the flash device has a state of "0." When there are no electrons inside the floating gate, the flash device has a state of "1." The "0" or "1" is determined based on a reference voltage.

When a high voltage is applied to the control gate, tunneling causes electrons to go from the cell's body through a barrier of oxide and into the floating gate, where the electrons can remain for a long time even after the power is turned off. In digital applications, a large amount of charge in the floating gate (i.e., more electrons are accumulated) correlates to a digital "0," and a low amount of charge in the floating gate (i.e., fewer electrons are accumulated) correlates to a digital "1." The digital "0" and "1" are extracted based on the current that flows through the flash cell when a reference voltage is applied to the control gate. Because the charge in the floating gate modify the resistance of the flash cell, the threshold voltage of the flash cell is also modified. When a reference voltage that is less than the modified threshold voltage is applied to the control gate, low current will flow through the drain which correlates to a digital "1." And when a reference voltage that is greater than the modified threshold voltage is applied to the control gate, a high current will flow through the drain, which correlates to a digital "0." So, during a read operation of the flash cell, a low current is read as a "1" and a high current is read as a "0."

Although values of "0" and "1" are used for digital circuitry, a variable value can be applied for analog applications. For example, in the current disclosure, a variable amount of charge can be stored in the flash cells such that a variable value can be stored in the flash cells. Depending on how much voltage difference is placed between the control gate and a channel formed in the body, the number of electrons that gets trapped inside the floating gate changes. Thus, a variable amount of threshold voltage is created, much like that in a ReRAM. The conductance of the flash device is used, rather than using the flash device as simply a digital memory device which only retains a bit of information.

Bit line 160 is a wire connected to the output of the column of 3D NAND flash cells 120, 130 and 140. The current from the 3D NAND flash cells 120, 130 and 140 flow through the bit line 160 and into integrator 170.

Integrator 170 integrates the total current that flows through the bit line 160. The integrator 170 can be a current integrator but is not limited thereto. The current integrator accumulates the total electric charge over a set time. The set time can be a predetermined amount of time it takes for a controller to perform the VMM process for a column of 3D NAND flash cells.

An output 180 of the integrator 170 carries the integrated current. The output 180 can be connected to a controller which measures the amount of current that is output from the integrator 170.

Figure 2:
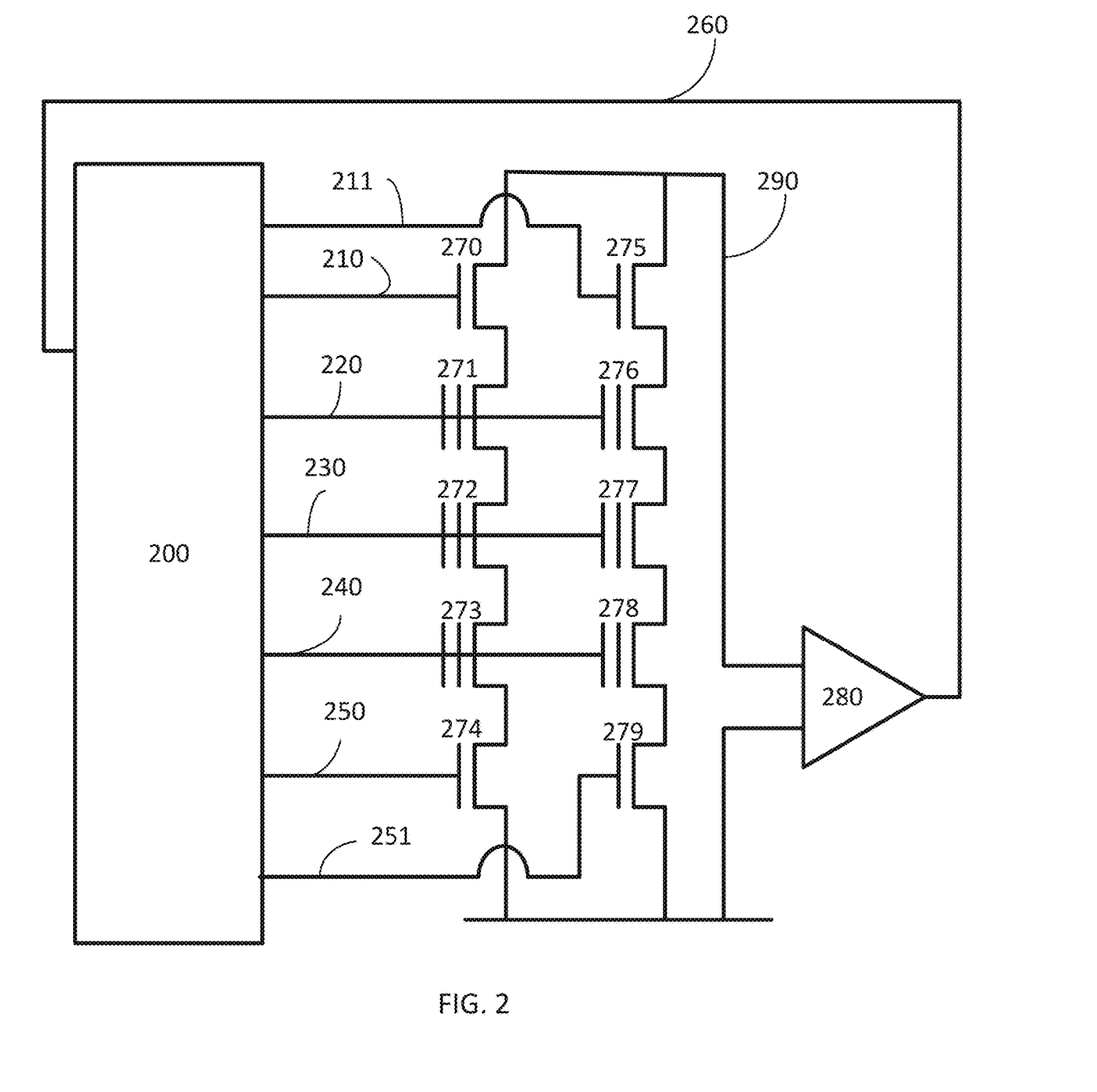
FIG. 2 is a block diagram of a controller connected to two columns of 3D NAND flash cells and an integrator according to an example embodiment.

FIG. 2 shows a block diagram of a controller 200 connected to two columns of 3D NAND flash cells and the integrator of FIG. 1, according to an example embodiment. The controller 200 controls a VMM operation performed in the 3D NAND flash cells. The controller 200 includes circuitry that controls which flash cells to turn on and off during the VMM operation. The controller 200 also includes circuitry that calculates how much current is being output by the integrator 280.

Top select lines 210 and 211 and bottom select lines 250 and 251 are wires that are output by the controller 200 and control which columns of 3D NAND flash cells to turn on. The top select line 210 is input to the top select transistor 270, the top select line 211 is input to the top select transistor 275, the bottom select line 250 is input to the bottom select transistor 274, and the bottom select line 251 is input to the bottom select transistor 279. The controller 200 outputs either an on or off signal to the select transistors 270, 274, 275 and 279, depending on whether that particular column of flash cells are to be read from or written into.

The controller 200 controls the operation of the individual flash cells via first word line 220, second word line 230, and third word line 240. The first, second, and third word lines 220, 230, and 240 are connected to the control gates of first flash cell 271, second flash cell 272, and third flash cell 273, respectively. The first, second, and third word lines 220, 230, and 240 are also connected to the control gates of the fourth flash cell 276, fifth flash cell 277, and sixth flash cell 278, respectively. When the top select line 210 and the bottom select line 250 are high, which turn on the select transistors 270 and 274, the controller 200 controls the first, second, and third flash cells 271, 272, and 273. When the top select line 211 and bottom select line 251 are high, which turns on the select transistors 275 and 279, the controller 200 controls the fourth, fifth, and sixth flash cells 276, 277, and 278. The operation of the word lines 220, 230, and 240 are described in detail below.

Flash cells 271, 272, 273, 276, 277, and 278 are 3D NAND flash cells arranged in two columns, where one column includes the cells 271, 272, and 273 and the other column includes 276, 277, and 278. The columns share a bit line 290 and an integrator 280. As discussed above, the columns of 3D NAND flash cells are activated when their respective select transistors are turned on.

A vector matrix multiplication (VMM) process will now be described. VMM is used in neural network processing where a vector is multiplied by a matrix to obtain an output vector. For illustration, a 3-input vector is multiplied by a 2×3 matrix in Equation 1 below:

$$[x_1\ x_2\ x_3] \cdot \begin{bmatrix} A_{11} & A_{12} \\ A_{21} & A_{22} \\ A_{31} & A_{33} \end{bmatrix} = [x_1A_{11} + x_2A_{21} + x_3A_{31}\ \ x_1A_{12} + x_2A_{22} + x_3A_{33}]$$

$$= [y_1\ y_2]$$

where $[x_1\ x_2\ x_3]$ represents the input layer, $$\begin{bmatrix} A_{11} & A_{12} \\ A_{21} & A_{22} \\ A_{31} & A_{33} \end{bmatrix}$$

represents a matrix of weights in the neural network (here, 6 weights in 3 connections to 2 layers), and $[y_1\ y_2]$ represents the output layer. The values of $[y_1\ y_2]$ are used to classify the input $[x_1\ x_2\ x_3]$. Although VMM is described in this disclosure, neural network processing with 3D NAND flash can be done for matrix vector multiplication (MVM), matrix matrix multiplication (MMM), and vector vector multiplication (VVM).

The VMM of a 2-input vector multiplied by a 2×3 matrix in Equation 1 can be generalized as Equation 2 below:

$$[x_1\ \ldots\ x_N] \cdot \begin{bmatrix} A_{11} & \cdots & A_{1M} \\ \vdots & \ddots & \vdots \\ A_{N1} & \cdots & A_{NM} \end{bmatrix} = [x_1A_{11} + \ldots + x_NA_{N1}\ \ x_1A_{12} + \ldots +$$

$$x_NA_{N2}\ \ldots\ x_1A_{1M} + \ldots + x_NA_{NM}]$$

$$= [y_1\ y_2\ \ldots\ y_M]$$

where there are N inputs, multiplied by a N×M matrix to obtain M outputs. Further, $$\begin{bmatrix} A_{11} & \cdots & A_{1M} \\ \vdots & \ddots & \vdots \\ A_{N1} & \cdots & A_{NM} \end{bmatrix}$$

is a matrix of weights used in the neural network. $A_{11} \ldots A_{N1}$ is the set of weights of the connections to first output node of the neural network, and the $A_{1M} \ldots A_{NM}$ is the set of weights of the connections to the $M^{th}$ output node of the neural network. $x_1A_{11} + \ldots + x_NA_{N1}$ is the dot product between the input vector (which corresponds to the input layer of a neural network) and the first set of weights, and $x_1A_{1M} + \ldots + x_NA_{NM}$ is the dot product between the input vector and the last set of weights. $[y_1\ y_2\ \ldots\ y_M]$ is the output vector which represents the output layer of the entire neural network. The output layer is used to classify the input vector. This is an example of a single layer neural network (i.e. one input layer and one output layer). This can be generalized to Deep Neural Networks (DNNs) comprising of one or more (e.g. n) hidden layer in between the input and output layer. The output of layer n−1 will be considered as the input of layer n for the VMM.

An example of an analog neural network which utilizes the VMM operation is described. For example, a sample neural network is designed to recognize the image of an animal and classify the animal according to species. The input vector $[x_1\ \ldots\ x_N]$ can be a set of values that represent the image in numerical format (e.g., values between 0 and 9). The sample neural network includes a set of hidden layers, where connections between layers have sets of weights. The weights are adjusted according to the training of the sample neural network. The matrix $$\begin{bmatrix} A_{11} & \cdots & A_{1M} \\ \vdots & \ddots & \vdots \\ A_{N1} & \cdots & A_{NM} \end{bmatrix}$$

represents the weights of a layer of the neural network. Each layer will have its own set of weights. When the input vector is multiplied by the matrix (i.e., dot product), the output vector represents the output layer of the neural network (in the case of a single layer neural network). Since the sample neural network is trained and designed to recognize animals, the output vector can represent the classifications of animals. For example, in a one-hot output vector, $y_1$ can represent a cat, $y_2$ can represent a dog, etc. Therefore, in this example, an output vector of $[1\ 0\ \ldots\ 0]$ would indicate that the sample neural network recognized the image as a cat. Although one-hot encoding is used in this example, one of ordinary skill will recognize that a variety of other encodings can be used for the output vector.

The application of VMM using 3D NAND flash will now be described. Referring to FIG. 2, a neural network of 3D NAND flash cells is shown. In this example, the sample analog neural network includes 3 input nodes and 2 output nodes. The first output node includes first, second, and third flash cells 271, 272, and 273. The second output node includes fourth, fifth, and sixth flash cells 276, 277, and 278. Because flash cells are non-volatile, each of the flash cells 271-273 and 276-278 are able to retain charges without power.

In analog neural networks, resistance caused by the trapped electrons in the floating gate correspond to a weight between the nodes. Thus, rather than digitizing the value of the charges in the floating gates as "0" or "1," VMM with 3D NAND flash utilizes the variance of the amount of charge trapped in the floating gates. Because the dot product in VMM is a combination of addition and multiplication of two sets of values, the linear region of the $I_d$-$V_g$ graph is used to calculate the activations. Therefore, rather than applying a high voltage such that the flash cell is fully conducting, the set of $V_g$ values used keeps the $I_d$ in the linear region.

At a first step of the VMM operation, the top select line 210 and the bottom select line 250 are set to high so that a current can flow through the flash cells 271-273. Then, the input value of $x_1$ is converted to a voltage value which is applied to the first flash cell 271 via the first word line 220. At the same time, a pass voltage $V_{pass}$ is applied to both flash cells 272 and 273 such that the two flash cells are conducting current. The current that flows through the first flash cell 271 flows to the integrator 280 via the bit line 290.

At a second step, the voltage on the first word line 220 is changed to the pass voltage $V_{pass}$, and the voltage on the second word line 230 is changed to a voltage value that corresponds to the input value of $x_2$. Then, as the first flash cell 271 and the third flash cell 273 are conducting, a current flows from the second flash cell 272 to the integrator 280 via the bit line 290. The integrator 280 adds the current from the second flash cell 272 from the second step to the current from the first flash cell 271 from the first step.

At a third step, the voltage on the second word line 230 is changed to the pass voltage $V_{pass}$, and the voltage on the third word line 240 is changed to a voltage value that corresponds to the input value of $x_3$. Then, as the first flash cell 271 and the second flash cell 272 are conducting, a current flows from the third flash cell 273 to the integrator 280 via the bit line 290. The integrator 280 adds the current from the third flash cell 273 from the third step to the integrated current from the second step. The resulting value corresponds to the dot product of the input vector and the first column in the matrix of Equation 1.

Once the integrator 280 integrates the currents from the first, second, and third steps, the total current is measured by the controller 200. This total current corresponds to the first output value $y_1$ of the output vector.

Then the VMM operation continues by bringing down the voltages of the top select line 210 and the bottom select line 250 which turns off the top and bottom select transistors 270 and 274. Voltages of the top select line 211 and the bottom select line 251 are set high to turn on the top and bottom select transistors 275 and 279 so that a current can flow through the flash cells 276-278.

At a fourth step, the input value of $x_1$ is converted to a voltage value which is applied to the fourth flash cell 276 via the first word line 220. At the same time, a pass voltage $V_{pass}$ is applied to both flash cells 277 and 278 such that the two flash cells are conducting current. The current that flows through the fourth flash cell 276 flows to the integrator 280 via the bit line 290.

At a fifth step, the voltage on the first word line 220 is changed to the pass voltage $V_{pass}$, and the voltage on the second word line 230 is changed to a voltage value that corresponds to the input value of $x_2$. Then, as the fourth flash cell 276 and the sixth flash cell 278 are conducting, a current flows from the fifth flash cell 277 to the integrator 280 via the bit line 290. The integrator 280 adds the current from the fifth flash cell 277 from the fifth step to the current from the fourth flash cell 276 from the fourth step.

At a sixth step, the voltage on the second word line 230 is changed to the pass voltage $V_{pass}$, and the voltage on the third word line 240 is changed to a voltage value that corresponds to the input value of $x_3$. Then, as the fourth flash cell 276 and the fifth flash cell 277 are conducting, a current flows from the sixth flash cell 278 to the integrator 280 via the bit line 290. The integrator 280 adds the current from the sixth flash cell 278 from the sixth step to the previously integrated current from the fifth step. The resulting value corresponds to the dot product of the input vector and the second column in the matrix of Equation 1.

Once the integrator 280 integrates the currents from the fourth, fifth, and sixth steps, the total current is measured by the controller 200. This total current corresponds to the second output value $y_2$ of the output vector.

Although it is shown in FIG. 2 that the same bit line 290 is connected to both columns of flash cells, two different bit lines can be connected to the two columns. In this case, there can be separate integrators connected to the separate bit lines.

Figure 3A:
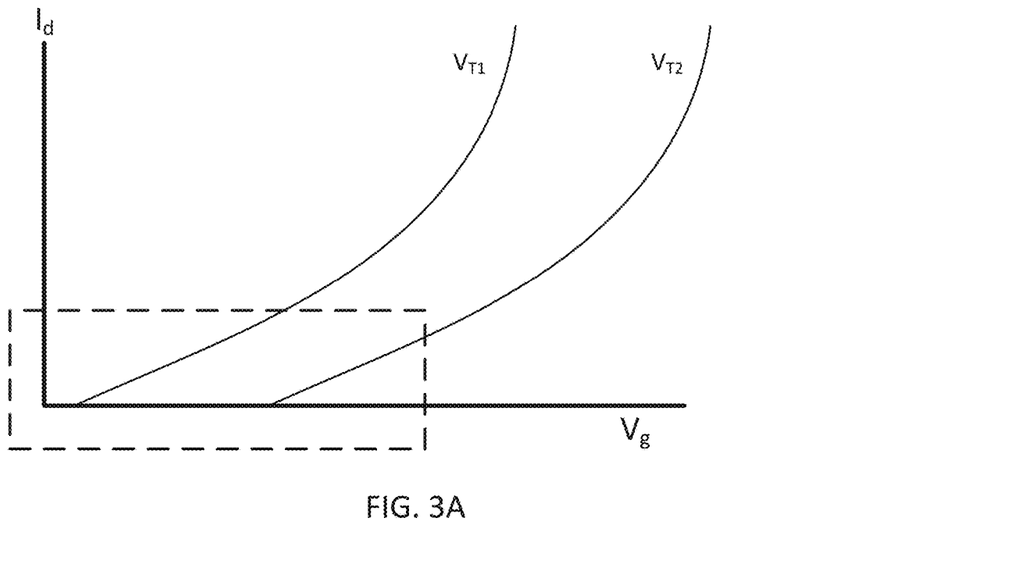
FIGS. 3A and 3B show graphs of the $I_d$-$V_g$ curve of a 3D NAND flash cell according to an example embodiment.

FIG. 3A shows an $I_d$-$V_g$ graph of a flash cell performing VMM to illustrate a sample set of values used for $V_g$, the voltage applied at the control gate of the 3D NAND flash cell. $V_{T1}$ corresponds to a threshold voltage value of the flash cell when the floating gate is full of electrons. $V_{T2}$ corresponds to a threshold value of the 3D NAND flash cell that is greater than $V_{T1}$. In an analog neural network that utilizes 3D NAND flash cells, a range of Vg is applied to the control gate when reading from the flash cell. The amount of current formed when the Vg is applied varies depending on how much resistance exists in the floating gate due to the trapped electrons. When a lot of electrons are trapped in the floating gate, there is a high resistance caused by the trapped electrons, and a low current is formed. When only a few or no electrons are trapped, there is less resistance, and a high current is formed.

Figure 3B:
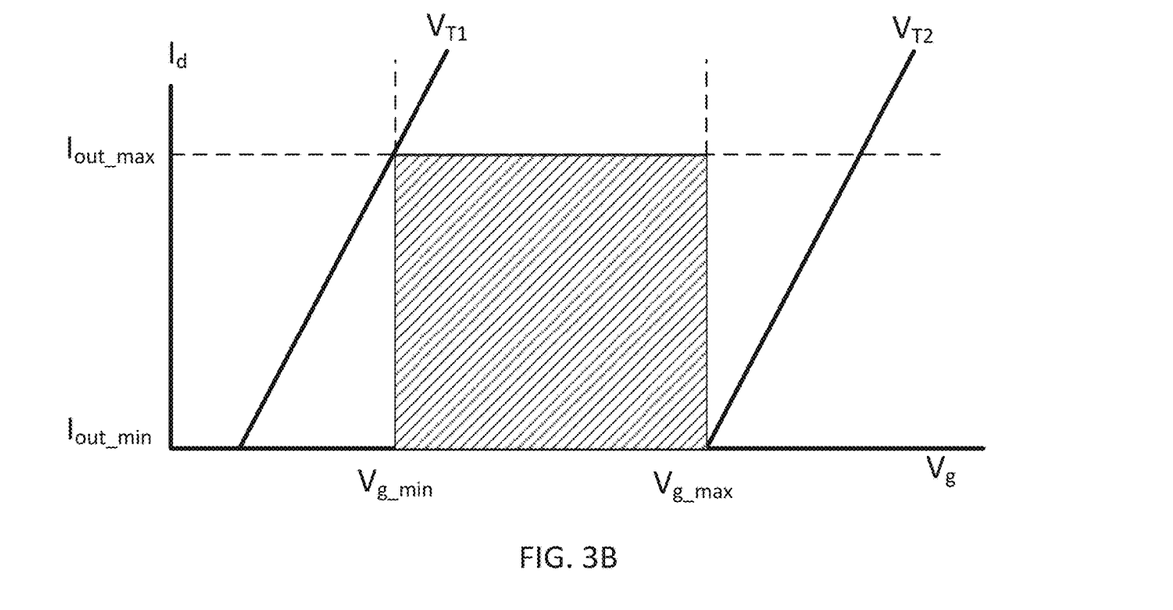

FIG. 3B shows a magnified view of the dashed rectangular region in FIG. 3A. Specifically, FIG. 3B shows the linear region of the $I_d$-$V_g$ graph of FIG. 3A. The box with a hatch pattern is the zone in which the VMM operates. In order to guarantee linear steps of current, it is preferred that the $V_g$ is low and that the output current $I_d$ from the flash cell have a linear relationship with $V_g$. This way the current from the other NAND flash cells in the column can be added linearly and accurately. Therefore, the $V_{g\_min}$ and $V_{g\_max}$ are the minimum and maximum voltages, respectively, that are applied to the control gates during the VMM operation. Similarly, $I_{out\_min}$ and $I_{out\_max}$ are the least and the most amounts of output current, respectively, that are measured from the flash cells for purposes of the VMM operation. This is to ensure that the integrator 280 can accurately sum the output currents.

Figure 4:
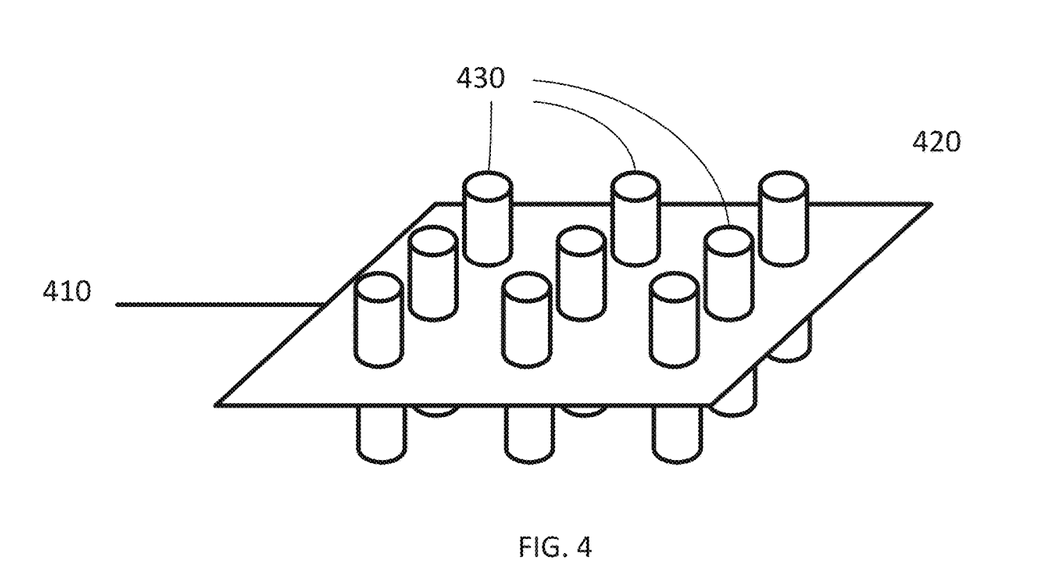
FIG. 4 is a diagram of a block of 3D NAND flash cells according to an example embodiment.

FIG. 4 shows a diagram of a block of 3D NAND flash cells according to an embodiment. The columns of flash cells 430 have been drawn as cylinders for simplicity. However, the flash cells 430 are similar to the flash cells shown in FIGS. 1 and 2. Furthermore, the controller that drives the VMM process of the neural network is not shown for simplicity.

Although a 3×3 block is shown in the figure, the technology is not limited thereto. For example, 4×4, 64×64, 64×128, and a variety of other combination of flash cells can be in one block. The arrangement of the flash cells is dependent on the physical layout of the 3D NAND flash chip. If a neural network included only block 420 of FIG. 4, in a possible configuration it could be considered as a neural network with 1 layer of 3 inputs and 3 outputs.

All of the NAND flash cells 430 in one block have their control gates connected to one another. Therefore, whenever a word line 410 carries a signal (e.g., a voltage), that signal is driven to all of the control gates of the flash cells in block 420. Furthermore, each of the flash cells 430 are connected to a different bit line. So, in FIG. 3, there are 9 bit lines (not shown) in total which are each connected to the drain of a NAND flash cell.

Figure 5:
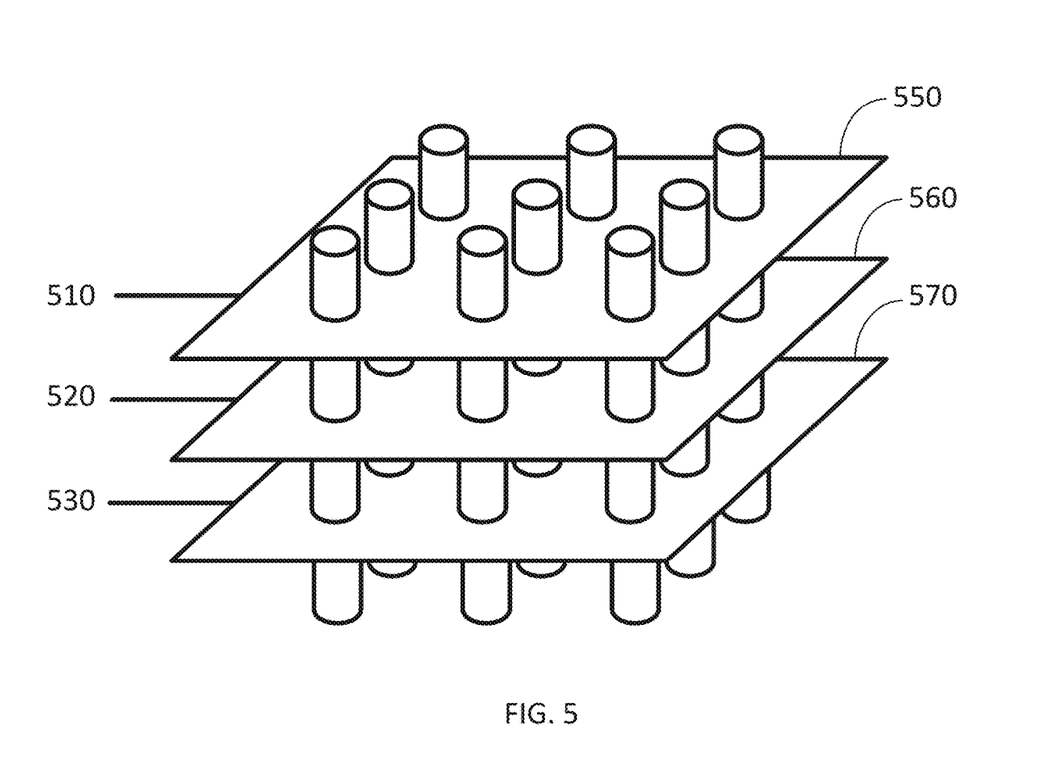
FIG. 5 is a schematic of a stack of blocks of 3D NAND flash cells according to an example embodiment.

FIG. 5 shows a stack of blocks of 3D NAND flash cells according to an embodiment. Although the figure shows a stack of three blocks, the technology is not limited thereto. For example, there could be 10 blocks, 20 blocks, 100 blocks, etc.

Each of the blocks 550, 560, and 570 is similar to the block 420 shown in FIG. 4. However, the blocks are stacked in this figure. Further, the word lines 510, 520, and 530 are connected to the blocks 550, 560 and 570, respectively. Specifically, the word lines 510, 520, and 530 are connected to the control gates of the flash cells in their respective blocks 550, 560, and 570.

One bit line (not shown) is connected to one column of flash cells, as discussed above. Therefore, in the 3D NAND flash structure shown in FIG. 5, there are 9 bit lines (not shown) that are respectively connected to the drains of each of the flash cells in block 550. Furthermore, each of the sources of the flash cells in block 550 is connected to a respective drain of the flash cells in block 560. Similarly, each of the sources of the flash cells in block 560 is connected to a respective drain of the flash cells in 570. In a possible configuration, each column of 3D NAND flash cells could represent a node in the neural network. Therefore, the neural network of FIG. 5 could be considered as a single layer with 3 inputs and 9 outputs. However, one of ordinary skill will appreciate that a neural network that built on a 9×3 3D NAND flash structure does not require the use of all of the 27 flash cells. Depending on the application, only 1 or 2 nodes may be used. This can be accomplished by using the top and bottom select transistors to turn off certain columns of flash cells and sending $V_{pass}$ signals to the word lines connected to the cells that are not being used.

In one embodiment, the controller can read from a plurality of flash cells at the same time. The controller (not shown) can drive a $V_{read}$ voltage to the block 550 to enable the $V_{read}$ voltage to be set for the control gate of all of the flash cells in block 550. In this case, there are 9 flash cells in block 550 that can receive this voltage at the same time. The controller can set the top and bottom select transistors (not shown) of all of the columns of flash cells to turn on such that all of the flash cells in blocks 560 and 570 are turned on. When this happens, the current from all of the flash cells in block 550 can flow through their respective bit line (not shown) and into their respective current integrator (not shown). Then, the same process can happen for all of the flash cells in block 560 and then again for all of the flash cells in block 570. Thus, the controller is able to perform VMM for the entire neural network through 3 read operations.

Figure 6:
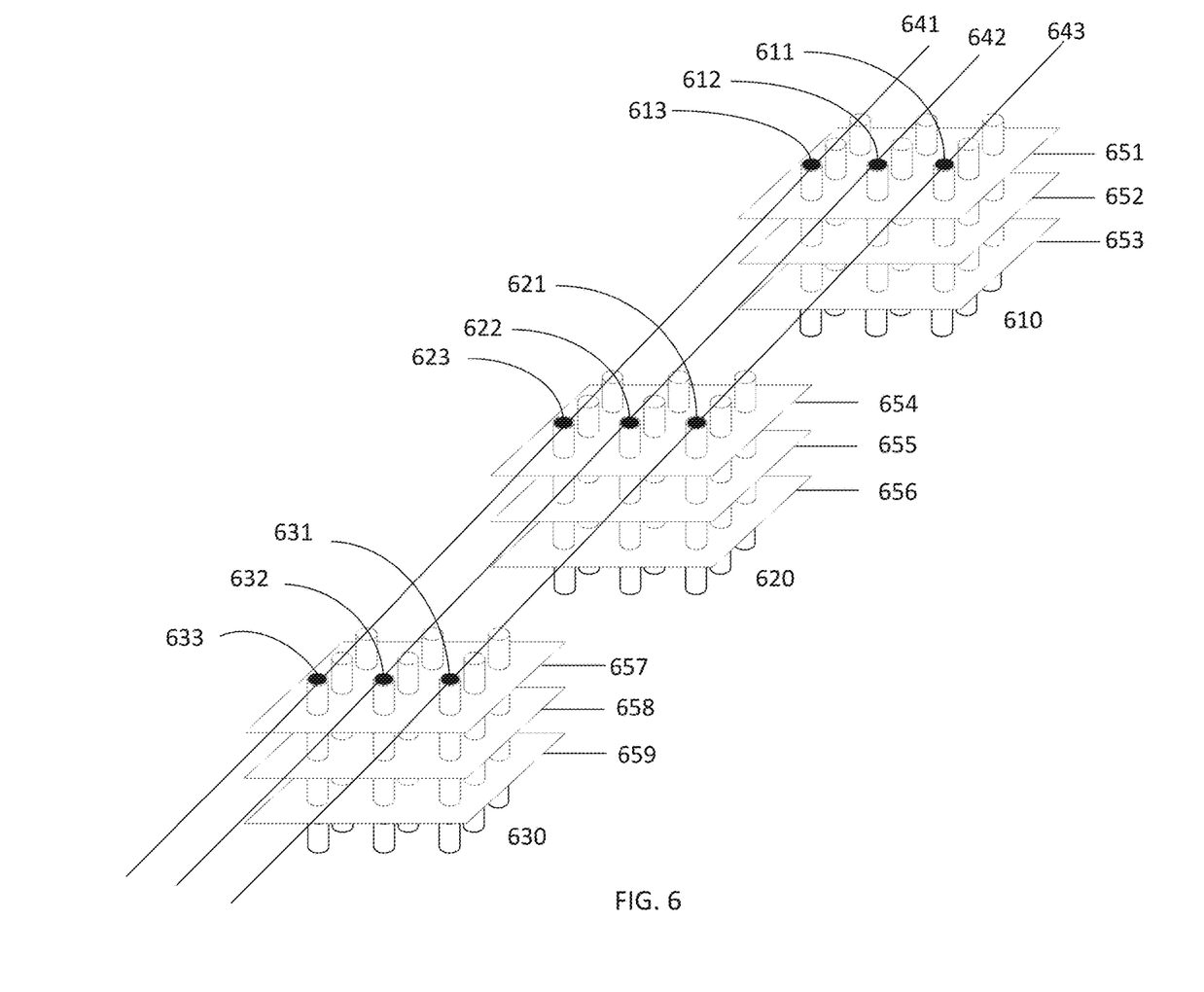
FIG. 6 shows a diagram of multiple stacks of 3D NAND flash cells is shown according to an example embodiment.

FIG. 6 shows a diagram of multiple stacks of 3D NAND flash cells according to an embodiment. In this example, each stack is similar to the stack shown in FIG. 5. Furthermore, there are three stacks of 3D NAND flash cells shown, but the technology is not limited thereto. Further, there are three blocks of flash cells in each stack shown, but the technology is limited thereto.

One of the benefits of using 3D NAND flash to perform PIM for analog neural network applications is that extant 3D NAND flash manufacturing techniques may be used. However, one limitation to such technique is the size of the 3D NAND flash chips. Currently, 3D NAND flash chips may include 64 or 96 layers of stacked NAND flash blocks. However, if the flash structure can only include 64 or 96 blocks, the neural network application is also limited to an input (i.e., input vector) of 64 or 96 input nodes. However, a neural network may require an input vector that includes more than 64 or 96 input nodes.

Referring to FIG. 6, three stacks of 3D NAND flash cells is shown. Each of the first stack 610, second stack 620, and third stack 630 includes three blocks, and each block includes 3×3 NAND flash cells, however the technology is not limited thereto. For each stack of 3D NAND flash cells, a bit line is connected to each of the NAND flash cells in the topmost block, as discussed in connection to the stack shown in FIG. 5. Although it is shown in FIG. 6 that each of the stacks of the same size and density, the plurality of stacks may have a different density or stack.

First bit line 641, second bit line 642, and third bit line 643 are connected to each of the stacks 610, 620, and 630. First bit line 641 is connected to flash cell 613 of first stack 610, flash cell 623 of second stack 620, and flash cell 633 of third stack 630. Second bit line 642 is connected to flash cell 612 of first stack 610, flash cell 622 of second stack 620, and flash cell 632 of third stack 630. Third bit line 642 is connected to flash cell 611 of first stack 610, flash cell 621 of second stack 620, and flash cell 631 of third stack 630. Furthermore, only three bit lines are shown for simplicity in illustration, but the technology is not limited thereto. In the example shown in FIG. 6, there are 9 bit lines, each bit line connected to a flash cell in all of the stacks.

Word lines 651, 652, and 653 are connected to a different block in stack 610, word lines 654, 655, and 656 are connected to a different block in stack 620, and word lines 657, 658, and 659 are connected to a different in stack 630. The word lines 651-659 are connected to a controller (not shown) which outputs signals/voltages to the blocks of the stacks 610, 620, and 630. As discussed above, the control gate of each of the NAND flash cells in a block are connected to one another.

During VMM, the 3D NAND flash structure including multiple stacks of 3D NAND flash cells (as in FIG. 6) can be utilized in a variety of ways. For example, one way is for the controller to drive each of the word lines 651-659 separately such that the signals in each word line represents a different node in a 9-node input layer of a neural network. In another embodiment, multiple word lines (e.g., word lines 651, 654, and 657) can be driven as if the blocks that are connected to those word lines are the same node in the input vector. This arrangement can occur, for example, when one block does not include enough flash cells to represent the neural network. In yet another embodiment, another group of word lines (e.g., word lines 651, 652, 653) can be drive as if the blocks that are connected to those word lines are the same node in the input vector.

The embodiments described provide numerous advantages. For example, the embodiments do not require modification of an array to enable a VMM operation. Furthermore, the embodiments described can perform operations sequentially. The VMM operation described herein can be applied to a wide range of machine learning workloads. As the VMM is implemented using 3D NAND flash, the operations are done very quickly.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. An apparatus that performs vector matrix multiplication (VMM) using an analog neural network (ANN), the apparatus comprising:
    a plurality of blocks of 3D NAND flash cells including a plurality of control gates, wherein the plurality of blocks are arranged in a stack, and wherein the stack represents a layer of the ANN and a resistance of each 3D NAND flash cell in the plurality of blocks represents a weight in the ANN;
    a plurality of word lines including a first word line, wherein the first word line is electrically connected to the plurality of control gates of the 3D NAND flash cells in a first block;
    a first bit line electrically connected to the 3D NAND flash cells of the first block; and
    a controller having programmed instructions to receive an input to be processed by the ANN,
        wherein the controller, during a read operation, applies a read voltage, via the first word line, to control gates of the 3D NAND flash cells in the first block such that a first current flows to the first bit line, and
        wherein the controller, during the read operation, applies a pass voltage, via the plurality of word lines except the first word line, to control gates of the 3D NAND flash cells in the plurality of blocks except the first block such that a second current flows to the first bit line.

2. The apparatus of claim 1, further comprising an integrator electrically connected to the first bit line, wherein the integrator integrates the first current and the second current.

3. The apparatus of claim 1, wherein the first current from the 3D NAND flash cell in the first block represents the weight of a neuron in the layer of the ANN.

4. The apparatus of claim 2, wherein the plurality of word lines includes a second word line electrically connected to the plurality of control gates of the 3D NAND flash cells in a second block,
    wherein the controller, during the read operation, applies the read voltage, via the second word line, to control gates of the 3D NAND flash cells in the second block such that a third current flows to the first bit line, and
    wherein the controller, during the read operation, applies the pass voltage, via the plurality of word lines except the second word line, to control gates of the 3D NAND flash cells in the plurality of blocks except the second block such that a fourth current flows to the first bit line.

5. The apparatus of claim 3, wherein the integrator integrates the third current and the fourth current with the integrated first current and second current.

6. The apparatus of claim 4, wherein the plurality of word lines includes a third word line electrically connected to the plurality of control gates of the 3D NAND flash cells in a third block,
    wherein the controller, during the read operation, applies the read voltage, via the third word line, to control gates of the 3D NAND flash cells in the third block such that a fifth current flows to the first bit line, and
    wherein the controller, during the read operation, applies the pass voltage, via the plurality of word lines except the third word line, to control gates of the 3D NAND flash cells in the plurality of blocks except the third block such that a sixth current flows to the first bit line.

7. The apparatus of claim 6, wherein the integrator integrates the fifth current and the sixth current with the integrated first, second, third, and fourth currents.

8. The apparatus of claim 1, wherein the integrator includes a current integrator.

9. The apparatus of claim 1, further comprising:
    a plurality of bit lines including the first bit line;
    a plurality of integrators connected to the plurality of bit lines; and
    a plurality of first select transistors located between the plurality of bit lines and the plurality of blocks of 3D NAND flash cells and a plurality of second select transistors located between the plurality of blocks of 3D NAND flash cells and ground.

10. The apparatus of claim 9, wherein the controller has further programmed instructions to, during the read operation, turn on all of the first select transistors and the second select transistors such that a plurality of second currents flow from all of the first block of 3D NAND flash cells to the plurality of bit lines.

11. The apparatus of claim 10, wherein the plurality of second currents flows into the plurality of integrators.

12. An apparatus for performing vector matrix multiplication (VMM) for an analog neural network (ANN), the apparatus comprising:
    a plurality of blocks of 3D NAND flash cells including a plurality of control gates, wherein the plurality of blocks is arranged in a plurality of stacks, and wherein each stack represents a layer of the ANN and a resistance of each 3D NAND flash cell in the plurality of blocks represents a weight in the ANN;
    a plurality of word lines including a first word line, wherein each word line is electrically connected to the plurality of control gates of the 3D NAND flash cells in the same block;
    a plurality of bit lines including a first bit line electrically connected to a first block of 3D NAND flash cells in a first stack and a second block of 3D NAND flash cells in a second stack; and
    a controller having programmed instructions to receive an input to be processed by the ANN,
        wherein the controller, during a read operation, selects the first word line and deselects the plurality of word lines connected to the first stack except the first word line,
        wherein the controller applies a read voltage, via the first word line, to control gates of the 3D NAND flash cells in the first block such that a first current flows to the first bit line, and
        wherein the controller applies a pass voltage, via the plurality of word lines except the first word line, to control gates of the 3D NAND flash cells in other blocks such that a second current flows to the first bit line.

13. The apparatus of claim 12, further comprising an integrator electrically connected to the first bit line, wherein the integrator integrates the first current and the second current.

14. The apparatus of claim 13, wherein the plurality of word lines includes a second word line, wherein, during the read operation, the controller selects the second word line and deselects the plurality of word lines except the second word line, wherein the controller applies the read voltage, via the second word line, to control gates of the 3D NAND flash cells in the first block such that a third current flows to the first bit line, and wherein the controller applies the pass voltage, via the plurality of word lines except the second word line, to control gates of the 3D NAND flash cells in other blocks such that a fourth current flows to the first bit line.

15. The apparatus of claim 14, wherein the integrator integrates the third current and the fourth current with the integrated first current and second current.

16. The apparatus of claim 15, wherein the plurality of word lines includes a third word line, wherein, during the read operation, the controller selects the third word line and deselects the plurality of word lines except the third word line, wherein the controller applies the read voltage, via the third word line, to control gates of the 3D NAND flash cells in the first block such that a fifth current flows to the first bit line, and wherein the controller applies the pass voltage, via the plurality of word lines except the third word line, to control gates of the 3D NAND flash cells in other blocks such that a sixth current flows to the first bit line.

17. The apparatus of claim 13, wherein the integrator integrates the fifth current and the sixth current with the integrated first, second, third, and fourth currents.

18. The apparatus of claim 13, wherein the integrator includes a current integrator.

19. An apparatus for performing vector matrix multiplication (VMM) for an analog neural network (ANN), the apparatus comprising:
  a column of NAND flash cells in series, wherein each NAND flash cell includes a control gate;
  a bit line connected to the column of NAND flash cells, wherein a current drawn from the NAND flash cells flows to the bit line;
  an integrator connected to the bit line; and
  a controller having programmed instructions to control the column of NAND flash cells by setting the voltage of the control gate of each NAND flash cell.

20. The apparatus of claim 19, wherein the integrator integrates a current from the column of NAND flash cells.

* * * * *